United States Patent [19]

Liu

[11] Patent Number: 5,571,732
[45] Date of Patent: Nov. 5, 1996

[54] METHOD FOR FABRICATING A BIPOLAR TRANSISTOR

[75] Inventor: William U. Liu, Richardson, Tex.

[73] Assignee: Texas Instruments Incorporated, Dallas, Tex.

[21] Appl. No.: 474,272

[22] Filed: Jun. 7, 1995

Related U.S. Application Data

[62] Division of Ser. No. 109,225, Aug. 19, 1993.

[51] Int. Cl.$^6$ ................................ H01L 21/265
[52] U.S. Cl. .................. 437/31; 437/126; 437/128; 437/133; 148/DIG. 72
[58] Field of Search ............... 437/31, 126, 133, 437/93, 128, 112; 148/DIG. 72

[56] References Cited

U.S. PATENT DOCUMENTS

| | | | |
|---|---|---|---|
| 4,889,831 | 12/1989 | Ishii et al. | 437/133 |
| 4,939,102 | 7/1990 | Hamm et al. | 437/31 |
| 5,065,200 | 11/1991 | Bhat et al. | 357/4 |
| 5,098,858 | 3/1992 | Ueno et al. | 437/176 |
| 5,156,995 | 10/1992 | Fitzgerald, Jr. et al. | 437/133 |
| 5,171,697 | 12/1992 | Liu et al. | 437/31 |
| 5,286,997 | 2/1994 | Hill | 257/586 |
| 5,351,128 | 9/1994 | Goto et al. | 257/192 |

OTHER PUBLICATIONS

T. S. Moise, et al., "Optical Properties of Strained Layer (111) B $Al_{0.15}Ga_{0.85}As$–$In_{0.04}Ga_{0.96}As$ Quantum Well Heterostructures", Journal of Electronic Materials, vol. 21, No. 1, 1992, pp. 119–124.

M. H. Lee, "Orientation Dependence of Breakdown Voltage in GaAs", Solid–State electronics, vol. 23, pp. 1007–1009, 1980.

*Primary Examiner*—Tuan H. Nguyen
*Attorney, Agent, or Firm*—Michael K. Skrehot; James Kesterson; Richard L. Donaldson

[57]  ABSTRACT

In one form of the invention, a bipolar transistor is disclosed, the transistor comprising a GaAs substrate in the (111) orientation 100, and an InGaAs region 106 over the substrate 100, the InGaAs region 106 having a first surface and a second surface, wherein the mole fraction of In in the InGaAs region 106 varies from said first surface to said second surface.

10 Claims, 5 Drawing Sheets

METHOD FOR FABRICATING A BIPOLAR TRANSISTOR

This is a divisional of application Ser. No. 08/109,225, filed Aug. 19, 1993.

FIELD OF THE INVENTION

This invention generally relates to semiconductor devices, and more particularly to heterojunction bipolar transistors having high performance and low base resistance.

BACKGROUND OF THE INVENTION

The advantages of the AlGaAs/GaAs heterojunction bipolar transistor (HBT) in high speed applications result both by virtue of its structure and from the superior carrier transport properties of GaAs. In comparison with homojunction bipolar transistors, HBTs simultaneously allow application of heavy base doping to reduce the base resistance, and low emitter doping to reduce the base-emitter capacitance while still maintaining excellent current gain. Together with the availability of semi-insulating substrates and higher electron mobility, HBTs in GaAs have achieved much higher values of $f_T$ and $f_{max}$ than the best Si bipolar transistors. In comparison with GaAs field-effect transistors (FETs), the superior properties of HBTs include; high transconductance due to the exponential current increase as a function of input voltage, and uniform threshold voltage because it is controlled by the built-in potential of the base-emitter junction. The threshold voltage is thus much more uniform than for a FET. Furthermore, HBTs are vertical structures in which the carrier transit times are established by epitaxial layer design, rather than critical lithographic dimensions. High performance HBTs can thus be fabricated without the expense of submicrometer lithography.

SUMMARY OF THE INVENTION

The properties inherent to the HBT make it ideally suited for use in power applications such as radio frequency amplifiers and transmitters. However, there is constant demand in industry for more efficient devices. In the HBT there are several factors that may influence its power gain. Two of these are the base resistance and base-collector breakdown voltage of the transistor. Attempts at lowering base resistance in the past have included the use of an InGaAs base layer. It is well known that InGaAs may be much more heavily doped than GaAs, hence, one is tempted to replace the traditions. GaAs base with InGaAs. However, the difference in lattice constants between the AlGaAs emitter, the InGaAs base, and the GaAs collector establishes strain in the material structure that can lead to undesirably high dislocation densities. This strain may be relieved by grading the In mole fraction within the base layer, but this grading produces an electric field within the InGaAs layer that is dependent upon the change in bandgap within the layer. The field is of higher strength in portions of the InGaAs layer containing a higher In mole fraction. The field polarity is dependent upon the direction of grading. Generally, a base layer having an In mole fraction that increases from an emitter to a collector layer will have a field established that aids carrier transport through the base, whereas a base layer having an In mole fraction that decreases from an emitter to a collector layer will have a field established that opposes carrier transport through the base.

Past attempts to fabricate a device that could benefit from the aiding field established with a low In mole fraction at the emitter-base junction graded throughout the base to a higher In mole fraction at the base-collector junction have suffered because base contact is typically made at the base surface that forms the emitter-base junction. A low In mole fraction at this surface results in lower maximum doping than in high In mole fraction regions, which in turn results in a high-resistance base contact.

If, in contrast, the In mole fraction is graded such that the high In content portion of the base occurs at the emitter-base junction and the lower In content portion occurs toward the base-collector junction, a low resistance contact can be established, but carriers traversing the base are subjected to an opposing field. The advantages of higher base doping are offset by the electric field that is established.

Another difficulty with bipolar transistor designs is that the base-collector breakdown voltage is directly related to the level of doping in the collector. Attempts at increasing the base-collector breakdown voltage have been constrained by the need for a high enough level of collector doping to avoid the Kirk effect (high-current falloff in the $f_T$ of a transistor is a direct result of a spreading of the base layer into the collector region of the device), while keeping the doping level low enough to provide a reasonable breakdown voltage. These are among the problems that the present invention is intended to address.

In one form of the invention, a bipolar transistor is disclosed, the transistor comprising a GaAs substrate in the (111) orientation; and an InGaAs base region over the substrate, the base region having a first surface and a second surface, wherein the mole fraction of In in the InGaAs base region varies from the first surface to the second surface.

In another fore of the invention, a method for fabricating a semiconductor device is disclosed, the method comprising providing a GaAs substrate in the (111) orientation, and forming an InGaAs region over the substrate, the InGaAs region having a first surface and a second surface, wherein the mole fraction of In in the InGaAs region varies from the first surface to the second surface.

In yet another form of the invention, a method for fabricating a semiconductor device is disclosed, the method comprising the steps of: forming an InGaAs base region between a collector region of a first material and an emitter region of a second material, the InGaAs base region having an In mole fraction that increases from an interface between the base and collector regions to an interface between the base and emitter regions, and further wherein the increasing mole fraction establishes an electric field that opposes carrier transport through the InGaAs region from the emitter to the collector; and forming the InGaAs region over a GaAs substrate of (111) orientation, thereby establishing a piezoelectric field in the InGaAs base region in a direction opposite that of the electric field.

An advantage of the invention is that it compensates for the electric field set up in the InGaAs base layer of an HBT, thereby resulting in a device that benefits from the increased base doping (and hence high power gain) allowed by an InGaAs base, while also achieving superior $f_T$ performance. An additional advantage of the invention is that GaAs grown on a (111) GaAs substrate has been shown to possess superior breakdown characteristics than when grown on conventional (100) substrates. This property allows for a higher base-collector breakdown voltages or higher collector current for a given breakdown voltage.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

HBTs are ideally suited for power applications. Because they are vertical devices they have the capability of providing a greater amount of output power for a given area of semiconductor surface than do field effect devices. Additionally, they have been shown to possess highly linear performance characteristics and have shown great promise in the all important category of efficiency. However, the efficiency of devices disclosed thus far in the art has indicated that there may be physical limitations in the device structures used to date. The efficiency problem may be addressed in several ways, one of which is a reduction of base resistance. As HBTs begin to be designed for higher-frequency operation, the base layer becomes thinner in order to lower the carrier base transit time (on which the cutoff frequency $f_T$ depends). However, thin base regions result in high base resistance and therefore lower device efficiency. A logical solution to this problem is to dope the base more heavily. However, the doping techniques currently available result in bases that are too lightly doped to have low resistance. This problem is particularly acute in pnp HBTs where the practical maximum n-type doping is roughly $2 \times 10^{18}$ cm$^{-3}$. Past attempts at solutions to this problem have included InGaAs base layers. It is well known that the maximum doping level in InGaAs increases as the In mole fraction increases. One would expect an InGaAs base to result in low base resistance, and therefore better device performance.

However, the use of an InGaAs base layer is complicated by the fact that InGaAs is not lattice matched to GaAs. The higher the mole fraction of In in the InGaAs, the more strain is introduced. Excessive strain results in a high number of dislocation defects which in turn results in low recombination times in the base, and consequently poor device performance. A method used in the past to relieve strain in an InGaAs layer is to vary the mole fraction of In throughout the thickness of the base layer.

Figure 1:
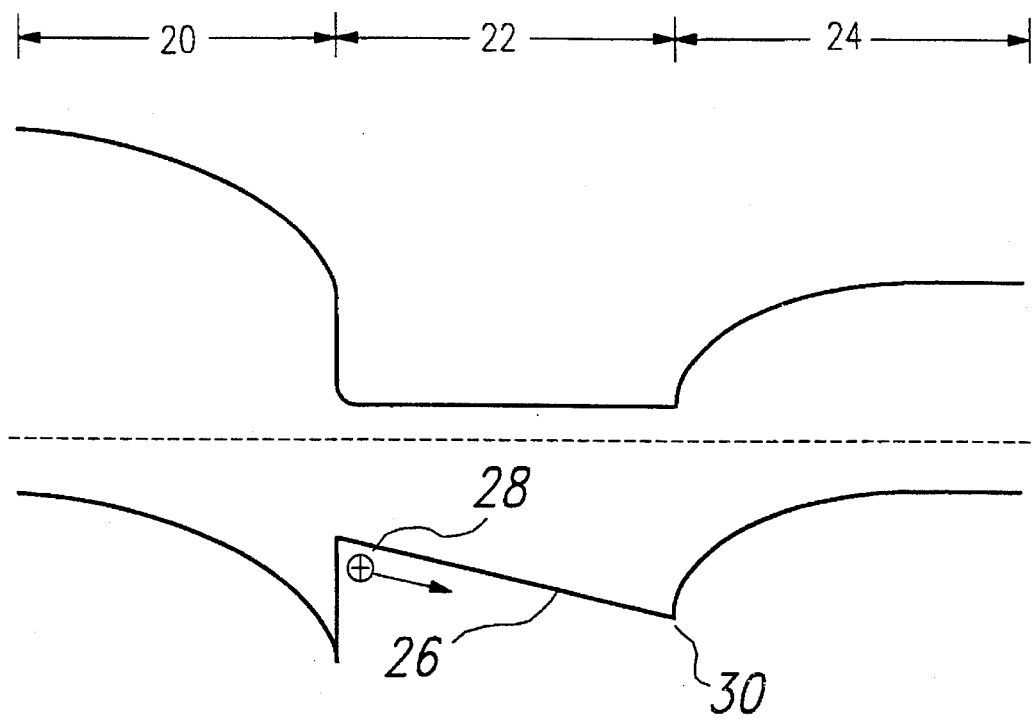
FIG. 1 is a band diagram of a pnp transistor having a graded InGaAs base layer grown on a (100) GaAs substrate.

In FIG. 1 is shown a band diagram of a typical pnp HBT comprising a p-doped emitter 20, of AlGaAs, for example, an n-doped InGaAs base 22, and a p-doped GaAs collector 24. The In mole fraction of the base 22 is graded from approximately 15% at the emitter-base junction to 0% at the base-collector junction. The grading of the In mole fraction is evident in the band diagram of FIG. 1 because of the increase in bandgap from the emitter-base junction to the base-collector junction. This arrangement provides an InGaAs base layer that is under much less strain than for an InGaAs base layer with a moderate to high mole fraction throughout its thickness, and more importantly, the InGaAs at the base-emitter junction can have an In mole fraction (about 15%) that allows it to be very heavily doped. Such heavy doping facilitates the formation of a low-resistance ohmic contact on the base surface.

Though this structure mitigates the problem of strain-induced dislocation defects and also allows for low-resistance ohmic contacts to the base, it has been shown to introduce another obstacle to improved device performance, namely an electric field caused by the difference in bandgap of the InGaAs at the emitter-base and base-collector junctions. Inspection of the valence band edge in the base 22 in FIG. 1, denoted by element 26, reveals a difference in potential over the length of the base. This difference in potential gives rise to an electric field which retards hole transport in the base 22 from the emitter 20 to the collector 24. In this example, with In mole fraction increasing linearly from the base-collector junction to the emitter-base junction, the electric field is relatively constant throughout the length of the base 22. This is illustrated in the electric field vs. distance plot of FIG. 2, in which trace 32 depicts the field induced by the bandgap difference. A more graphic way of illustrating the point is that a hole 28, in FIG. 1, must overcome the energy barrier comprising the sloping valence band edge 26 and peak 30 in order to be transported into the collector 24. This requirement on carrier transport results in longer base transit times, which results in lower cutoff frequency $f_T$, and is therefore undesirable.

Figure 4:
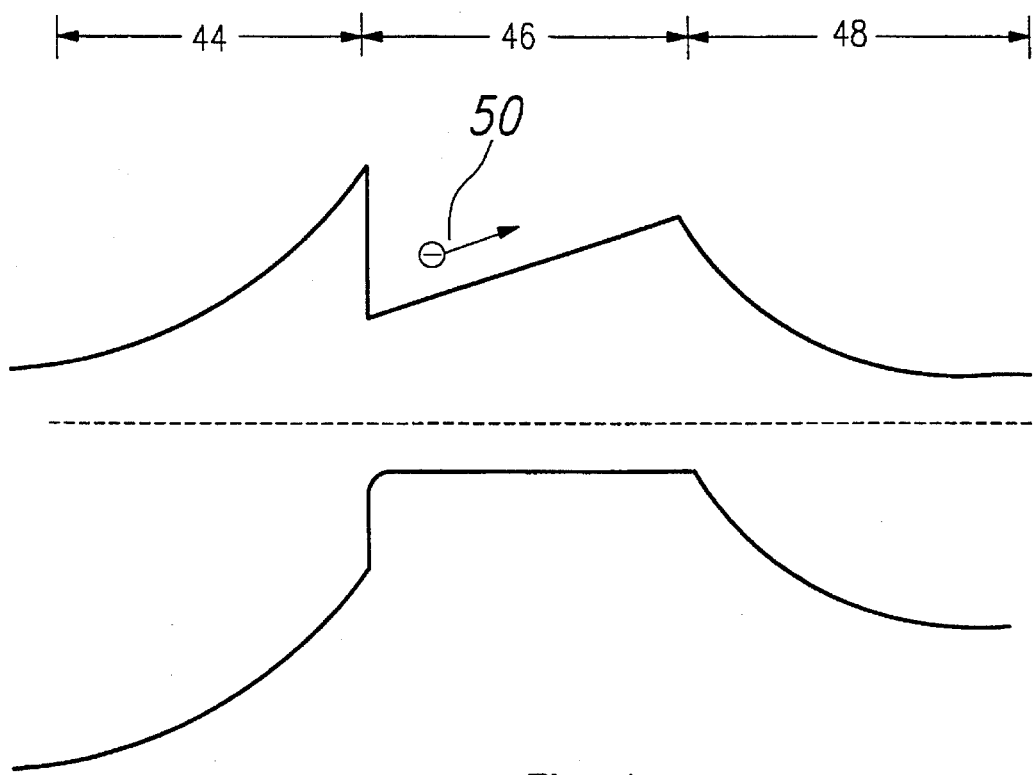
FIG. 4 is a band diagram of a npn transistor having a graded InGaAs base layer grown on a (100) GaAs substrate.
Figure 5:
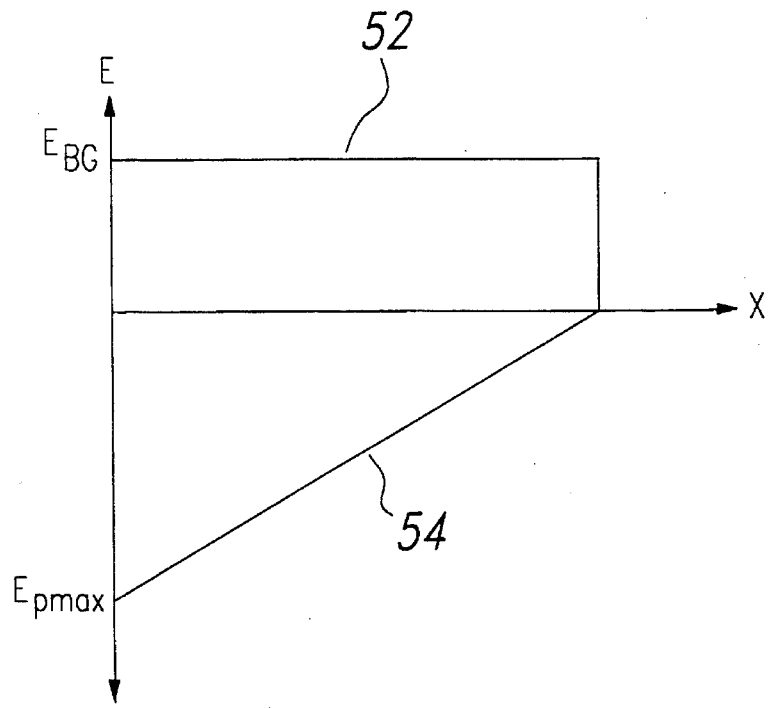
FIG. 5 is a plot of electric field intensity in a base layer of a npn transistor for bandgap-induced and piezoelectric fields.

The dual of this phenomenon for an npn transistor with emitter 44, base 46, and collector 48 is shown in FIGS. 4 and 5. In this case, the carriers (electrons) 50 must overcome a gradually sloped potential barrier in the conduction band. The electric field plot 52 of FIG. 4 is identical, but of reverse polarity.

Epitaxial layer growth on GaAs is usually done on substrates of the (100) orientation. Investigations have shown that GaAs and AlGaAs epitaxial layers deposited on (100) GaAs substrates exhibit excellent morphology for nearly all growth regimes of interest. In contrast, (111) substrates have been reported to result in poor morphology. This is supported by the fact that the vast majority of devices fabricated of epitaxial layers on GaAs substrates are on (100) substrates. However, recent advances in epitaxial material growth (molecular beam epitaxy (MBE) and metalorganic chemical vapor deposition (MOCVD) for example) have made it possible to grow epitaxial layers of good morphology on (111) substrates. The (111) substrates may be categorized into (111)A and (111)B, depending upon which of Ga or As predominate in the growth surface (in (111)A As predominates and in (111)B Ga predominates).

It has recently been discovered that strained layer AlGaAs/InGaAs quantum well heterostructures grown on (111)B GaAs substrates exhibit unique physical properties as compared to structures grown on traditional (100) substrates. Specifically, photoluminescence measurements have been used to identify a strain-induced electric field of order $6.7×10^4$ Vcm$^{-1}$ within a quantum well comprising 4% In mole fraction InGaAs between layers of AlGaAs grown on (111)B substrates (see T.S. Moise, et al. "Optical properties of strained layer (111)B Al$_{0.15}$Ga$_{0.85}$As-In$_{0.04}$Ga$_{0.96}$As quantum well heterostructures", Journal of Electronic Materials, vol. 21, no. 1 1992, pp 119–124).

Figure 2:
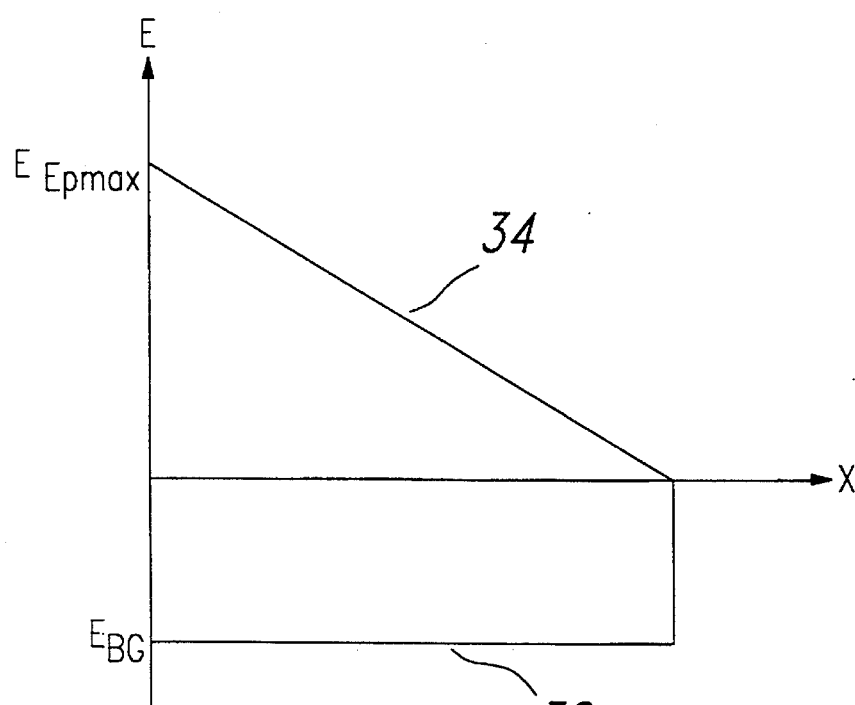
FIG. 2 is a plot of electric field intensity in a base layer of a pnp transistor for bandgap-induced and piezoelectric fields.

Applicant has discovered that this piezoelectric field is a potential solution to the bandgap-induced field described above for HBTs having InGaAs bases with graded In mole fraction. A pnp HBT grown on a (111)B substrate rather than the traditional (100) substrate can be designed to take advantage of the piezoelectric field. As the In mole fraction increases in going from the base-collector interface to the emitter-base interface, the lattice constant of the InGaAs base layer differs more from the GaAs or AlGaAs emitter. This results in increasing lattice strain from the base-collector interface to the emitter-base interface. This strain produces the electric field described by Moise, except that in this case its strength varies with the In mole fraction throughout the base. A plot 34 of the piezoelectric field intensity for linear In mole fraction grading is shown in FIG. 2. Of critical importance is the electric field's polarity. It has been shown that the piezoelectric field of a 4% In mole fraction InGaAs layer grown on a (111)B GaAs substrate is such that a hole would be propelled in the direction of the substrate, and therefore in opposition to the direction of material growth. For a pnp transistor with an InGaAs base having an In mole fraction that varies as described above, this piezoelectric field opposes the field set up by the graded bandgap. Superposition of the fields plotted in FIG. 2 would cancel most of the bandgap-induced field 32, while some of the piezoelectric field 34 may be residual. This residual field could serve to increase device performance by propelling holes across the base with a shorter transit time than without the aiding field. The amount of residual field at a given point within the base layer is determined by the In mole fraction at that point. Thus, a 12% In mole fraction can induce a piezoelectric field having a magnitude ($E_{Pmax}$ in FIG. 2) of approximately $2×10^5$ V/cm, whereas the field induced by the graded InGaAs bandgap is estimated to be only about $-3.3×10^4$ V/cm in this example ($E_{BG}$ in FIG. 2). Consequently, as this example suggests, a high base doping near the base-emitter junction can be attained without the deleterious effects of the opposing grading-induced electric field that has impeded carrier transport through the base in prior art devices.

Figure 3:
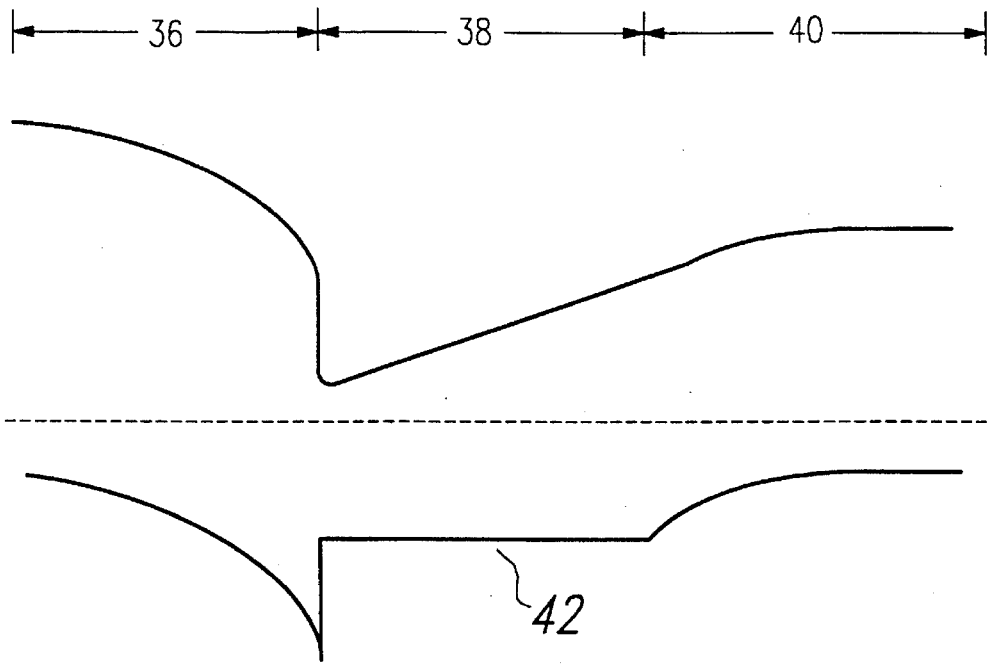
FIG. 3 is a band diagram of a pnp transistor having a graded InGaAs base layer grown on a (111)B GaAs substrate.
Figure 6:
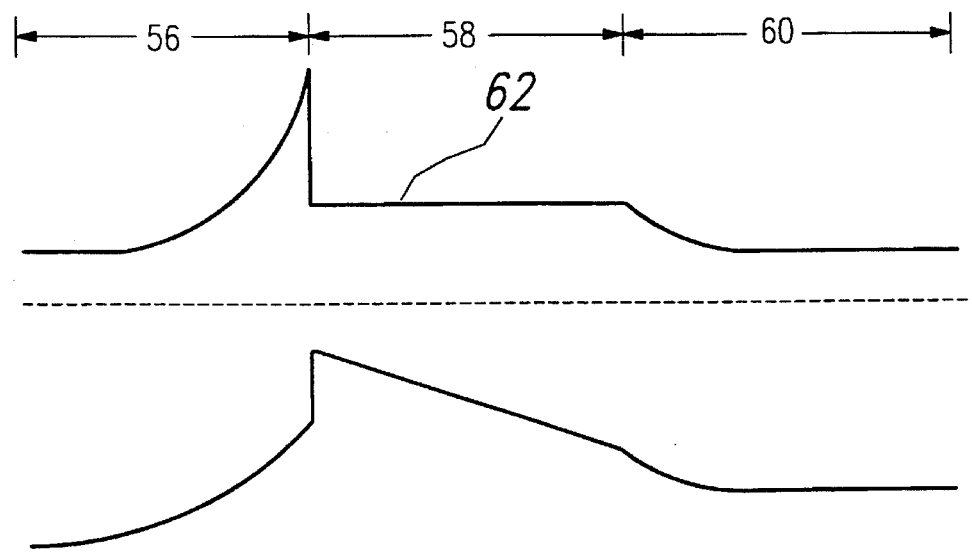
FIG. 6 is a band diagram of a npn transistor having a graded InGaAs base layer grown on a (111)A GaAs substrate.

FIG. 3 is an estimate of how the band diagram of FIG. 1 would look after a piezoelectric field just compensates the field induced by the graded InGaAs bandgap (note that valence band edge 42 is approximately level, rather than tilted down to the right as in FIG. 1). A piezoelectric field that more than compensates for the bandgap induced field serves to tilt the valence band edge up and to the right, thereby propelling holes that emerge from the emitter 36 through the base layer 38 and into the collector layer 40. FIG. 6 is the dual of FIG. 3 for an npn transistor.

It should be noted that advantages my arise from a non-linear pattern of In mole fraction variation in the base layer. For example, the In mole fraction may be increased in an exponential or parabolic manner from the base-collector interface to the emitter-base interface. The electric field from such a configuration would also be exponential and may result in ballistic, or at least faster, carrier transport through the base.

Figure 7:
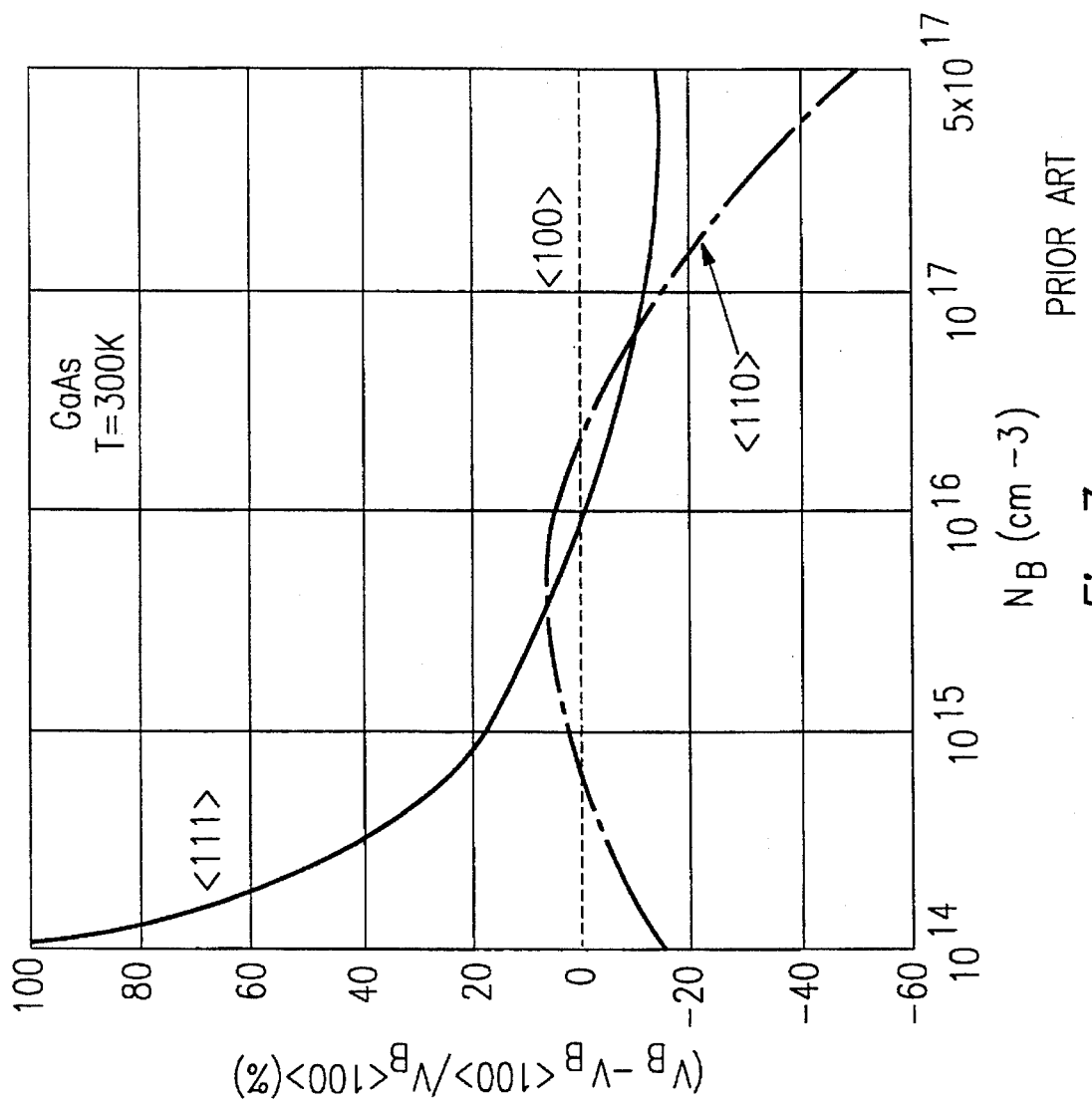
FIG. 7 is a plot of breakdown voltages for substrate orientations relative to the (100) orientation, vs. doping concentration.

GaAs in the (111) orientation has advantages in addition to those discussed above. In particular, (111) GaAs has been shown to provide higher breakdown voltages than GaAs in the (100) and (110) orientations for doping concentrations less than approximately $5×10^{15}$ cm$^{-3}$ (see FIG. 7 and M. H. Lee and S. M. Sze "Orientation dependence of breakdown voltage in GaAs", Solid State Electronics, Vol. 23, pp. 1007–1009, 1980). This is beneficial in bipolar transistors because the doping concentration of the collector region is typically below $5×10^{15}$ cm$^{-3}$. In practice the collector doping is critical in establishing functionality and performance in a bipolar transistor. While it is desirable to dope the collector very lightly and therefore produce a base-collector junction with very good breakdown characteristics, a very lightly doped collector will suffer from base pushout, or the Kirk effect. In this condition, current flowing from the base into the collector will have the effect of producing a charge in the collector having polarity opposite that of the dopant in the collector. The net effect is a canceling of the dopant-induced charge and a conversion of the collector layer into an extension of the base layer, hence the name "base push-out". This in effect increases the thickness of the base by the collector thickness which in turn increases the base transit time of carriers through the base. The result on device performance is a dramatic dropoff in the cutoff frequency, $f_T$. The Kirk effect turns a thin base transistor optimized for high frequency operation into a thick base transistor suitable only for low frequency operation.

However, since Sze has found that the use of (111) GaAs approximately doubles the breakdown voltage compared to (100) GaAs (assuming a doping concentration of approximately $1×10^{14}$ cm$^{-3}$), a collector comprising (111) should be able to provide increased base-collector breakdown voltage for a given doping concentration (below $5×10^{15}$ cm$^{-3}$). Hence, the tradeoff between high breakdown voltage and base pushout is not as constraining for a collector layer of (111) GaAs.

Figure 8:
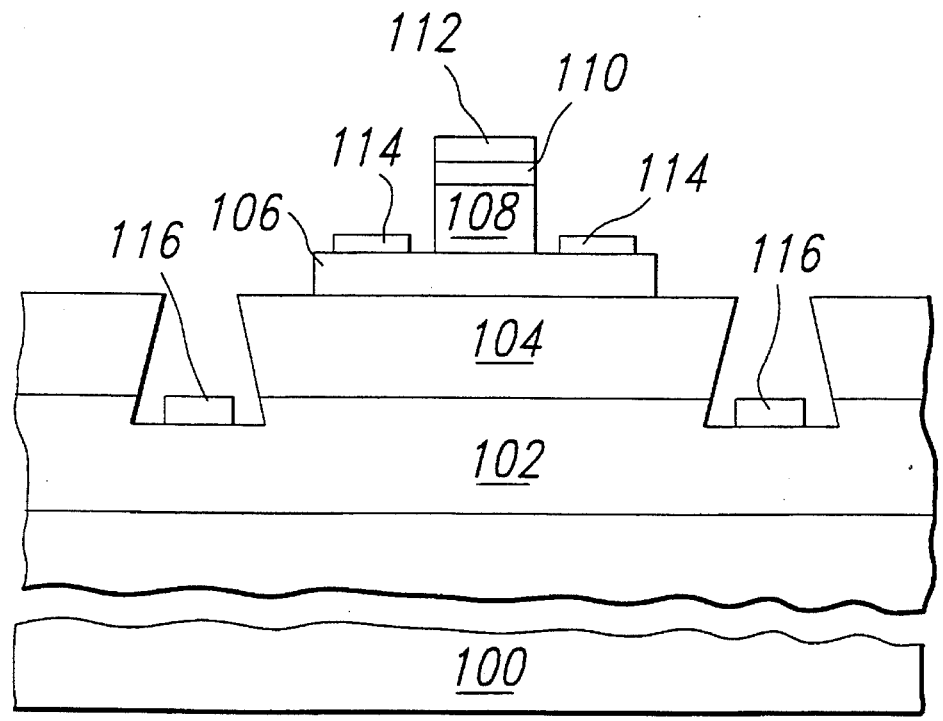
FIG. 8 is a cross-sectional view of a first preferred embodiment transistor.

In a first preferred embodiment structure shown in FIG. 8, a pnp bipolar transistor is based on a (111)B GaAs substrate 100. A subcollector layer 102, of GaAs for example, approximately 1.0 um in thickness and doped with C for example to a concentration of approximately $5×10^{19}$ cm$^{-3}$ is then formed epitaxially on the substrate 100 by a technique such as metal-organic chemical vapor deposition (MOCVD) or molecular beam epitaxy (MBE) for example. Other layers subsequently formed in a similar manner include: a collector layer 104, of GaAs for example, approximately 1.0 um in thickness and doped with C for example to a concentration of less than approximately $5×10^{16}$ cm$^{-3}$, but preferably about $2×10^{16}$ cm$^{-3}$; a base layer 106, of InGaAs for example, approximately 500 Å in thickness and doped with Si for example to as high a concentration as is practical (i.e. in the range of approximately $5×10^{18}$ cm$^{-3}$ to approximately $2×10^{19}$ cm$^{-3}$), but preferably about $2×10^{19}$ cm$^{-3}$, the base layer 106 also having its In mole fraction linearly graded from 0% at the base-collector interface to approximately 15% at its top surface; and on emitter layer 108, of AlGaAs for example, but alternately of GaAs, approximately 1000 Å in thickness, and doped with C for example to a concentration of approximately $5×10^{17}$ cm$^{-3}$. Ohmic contact to the emitter layer 108 is facilitated by a highly p-doped GaAs layer 110, approximately 200 Å in thickness doped with C for example to a concentration of approximately $1×10^{20}$ cm$^{-3}$. Contact to GaAs layer 110 is made with a contact metal 112 comprising a evaporated layer of Ti for example, of approximately 500 Å in thickness, followed by evaporated layers of Pt and Au for example, of approximately 250 Å and 2000 Å thickness, respectively. Contact is made to the base and collector layers with contacts 114 and 116, respectively, comprising evaporated Ti/Pt/Au for example, in thicknesses of approximately 500, 250 and 1500 Å, respectively.

The emitter and base mesas are formed in the standard manner, with a combination of dry and wet etching. The emitter mesa is formed using a reactive ion etching technique with $BCl_3$, for example, as the reactant. The base and collector layers may be wet etched with a solution of $H_2SO_4:H_2O_2:H_2O$ in the ratio of 1:8:160 by volume, for example.

It should be noted that though the first preferred embodiment was described as a pnp transistor, the invention provides benefit to npn transistors as well. For example, for an npn transistor the substrate 100 will preferably be of the (111)A orientation, so as to generate a piezoelectric field of a polarity opposite that of the (111)B substrate. Additionally, the collector 102 and emitter 108 layers will be doped n-type with Si, for example, while the base layer 106 will be doped with C, for example. Additionally, an InGaAs cap layer over the emitter may be used to provide the high level of n-type doping necessary for forming a low-resistance ohmic contact (an In mole fraction of approximately 50% may be used to ensure a high maximum doping level).

Figure 9:
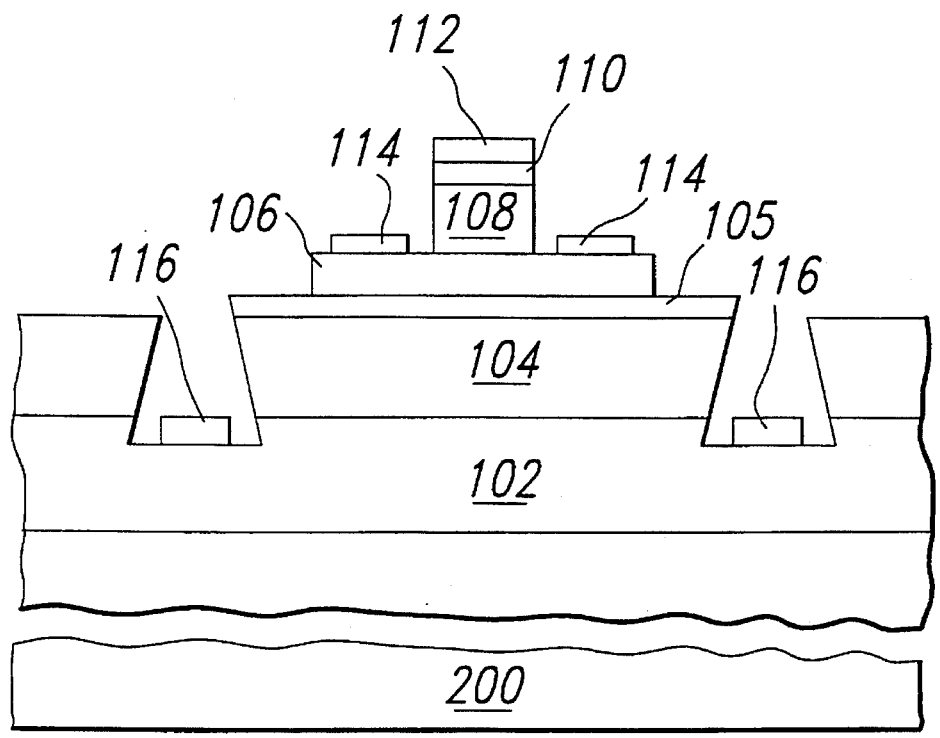
FIG. 9 is a cross-sectional view of a second preferred embodiment transistor.

A second preferred embodiment is shown in FIG. 9. It differs from the first embodiment by the inclusion of a second collector layer 105, of GaAs, for example. In this embodiment, the first collector layer 104 is lightly doped, or undoped, (approximately $1\times10^{14}$ $cm^{-3}$), and the second collector layer 105 is doped heavily to a concentration of approximately $1\times10^{18}$ $cm^{-3}$. The thickness of the first collector layer 104 is again about 1.0 um as in the first embodiment, while the second collector layer 105 is much thinner, at about 400 Å. As described in co-assigned U.S. Pat. No. 5,171,697, this configuration has advantages in terms of device performance that are independent of the substrate orientation.

The second collector layer 105, which is adjacent to the base 106, is doped heavily, but its width should be thin enough so that this layer is depleted, preferably even at zero external base-collector bias. This is because during the operation of a high frequency power bipolar transistor, the base-emitter bias is continuously varied from zero to a value limited by the collector-emitter breakdown voltage. If during any part of the cycle the collector is not fully depleted, part of the power will be dissipated in the undepleted portion of the collector, which constitutes essentially a parasitic collector resistance. Consequently, if the collector con be fully depleted even at zero bias, then there will be no parasitic power dissipation associated with the collector at any given bias condition. The purpose of this thin heavily doped layer 105 is to create a large magnitude of electric field in the junction area close to the base layer 106. This large field raises the collector current level at which the base pushout phenomenon occurs.

The addition of the second collector layer 105 reinforces the benefits of fabricating the transistor on a (111) substrate, because the breakdown benefits of using the (111) substrate occur primarily for lightly doped layers (such as the first channel layer 104). The use of the second channel layer 105 in conjunction with a (111) substrate is expected to double the collector-emitter breakdown voltage of the transistor.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, although the n and p dopants described herein were Si and C, respectively, it may be appreciated that other dopants will be suitable as well. As an alternative to Si, Sn, S or Pb may be used, and as an alternative to C, Be or Zn my be used. Additionally, the first and second embodiment structures my include buffer and grading layers not shown in the Figures, but that are commonly known in the art to facilitate layer growth or fabrication. It is intended that the appended claims encompass any such modifications or embodiments.

What is claimed is:

1. A method for fabricating a bipolar transistor comprising the steps of:

providing a GaAs substrate in the (111) orientation; and forming an InGaAs region over said substrate, said InGaAs region having a first surface and a second surface, wherein the mole fraction of the indium in said InGaAs region varies from said first surface to said second surface.

2. The method of claim 1 wherein said step of forming an InGaAs region comprises varying the In mole fraction from approximately 0% at said first surface to approximately 15% at said second surface.

3. The method of claim 1 wherein said step of providing a GaAs substrate in the (111) orientation comprises providing a GaAs substrate is in the (111)B orientation and wherein said step of forming an InGaAs region includes the step of doping said region n-type.

4. The method of claim 1 wherein said step of providing a GaAs substrate in the (111) orientation comprises providing a GaAs substrate is in the (111)A orientation and wherein said step of forming an InGaAs region includes the step of doping said region p-type.

5. The method of claim 1 wherein said step of forming an InGaAs region comprises varying the In mole fraction linearly from said first surface to said second surface.

6. A method for fabricating a bipolar transistor comprising the steps of:

forming an InGaAs base region between a collector region of a first material and an emitter region of a second material, said InGaAs base region having an indium mole fraction that increases from an interface between said base and collector regions to an interface between said base and emitter regions, and further wherein said increasing mole fraction establishes an electric field that opposes carrier transport through said InGaAs region from said emitter to said collector; and forming said InGaAs region over a GaAs substrate of (111) orientation, thereby establishing a piezoelectric field in said InGaAs base region in a direction opposite that of said electric field.

7. The method of claim 6 wherein said InGaAs region wherein said step of forming an InGaAs region comprises varying the In mole fraction from approximately 0% at said collector-base interface to approximately 15% at said base-emitter interface.

8. The method of claim 6 wherein said step of forming said GaAs substrate in the (111) orientation comprises providing a GaAs substrate is in the (111)B orientation and wherein said step of forming said InGaAs region includes the step of doping said region n-type.

9. The method of claim 6 wherein said step of forming said GaAs substrate in the (111) orientation comprises providing a GaAs substrate is in the (111)A orientation and wherein said step of forming said InGaAs region includes the step of doping said region p-type.

10. The method of claim 6 wherein said first and second materials are the same.

* * * * *